US009771261B1

(12) United States Patent
Stringer et al.

(10) Patent No.: US 9,771,261 B1
(45) Date of Patent: Sep. 26, 2017

(54) SELECTIVE PATTERNING OF AN INTEGRATED FLUXGATE DEVICE

(71) Applicant: Texas Instruments Incorporated, Dallas, TX (US)

(72) Inventors: Lee Alan Stringer, McKinney, TX (US); Mona Eissa, Allen, TX (US); Byron J. R. Shulver, Richardson, TX (US); Sopa Chevacharoenkul, Richardson, TX (US); Mark R. Kimmich, Frisco, TX (US); Sudtida Lavangkul, Richardson, TX (US); Mark L. Jenson, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/072,852

(22) Filed: Mar. 17, 2016

(51) Int. Cl.
G01R 33/04 (2006.01)
B81C 1/00 (2006.01)
G01R 33/00 (2006.01)

(52) U.S. Cl.
CPC ...... B81C 1/00825 (2013.01); G01R 33/0047 (2013.01); G01R 33/04 (2013.01); B81C 2201/014 (2013.01); B81C 2201/0138 (2013.01)

(58) Field of Classification Search
None
See application file for complete search history.

(56) References Cited

U.S. PATENT DOCUMENTS 5,726,102 A * 3/1998 Lo .................. H01L 21/0275
257/E21.028
7,407,596 B2 8/2008 Choi et al.
7,737,687 B2 6/2010 Na et al.
2009/0068761 A1 3/2009 Lotfi et al.
2009/0267188 A1* 10/2009 Piner ................ H01L 29/66462
257/613
2013/0049749 A1 2/2013 Mohan et al.
2016/0154069 A1* 6/2016 Eissa .................. G01R 33/0052
324/253

FOREIGN PATENT DOCUMENTS

EP 0273195 6/1993
WO 2004040665 A2 5/2004
WO 2007126164 A1 11/2007

OTHER PUBLICATIONS

Notification of Transmittal of the International Search Report and the Written Opinion of the International Searching Authority, or the Declaration, dated Jun. 29, 2017.

* cited by examiner

Primary Examiner — Whitney T Moore
(74) Attorney, Agent, or Firm — Tuenlap D. Chan; Charles A. Brill; Frank D. Cimino

(57) ABSTRACT

A method comprises forming an etch stop layer, a first titanium layer, a magnetic core, a second titanium layer, and patterning the first and second titanium layers. The etch stop layer is formed above a substrate. The first titanium layer is formed on the etch stop layer. The magnetic core is formed on the first titanium layer. The second titanium layer has a first portion encapsulating the magnetic core with the first titanium layer, and a second portion interfacing with the first titanium layer beyond the magnetic core. The patterning of the first and second titanium layers includes forming a mask over a magnetic core region and etching the first and second titanium layers exposed by the mask using a titanium etchant and a titanium oxide etchant.

17 Claims, 12 Drawing Sheets

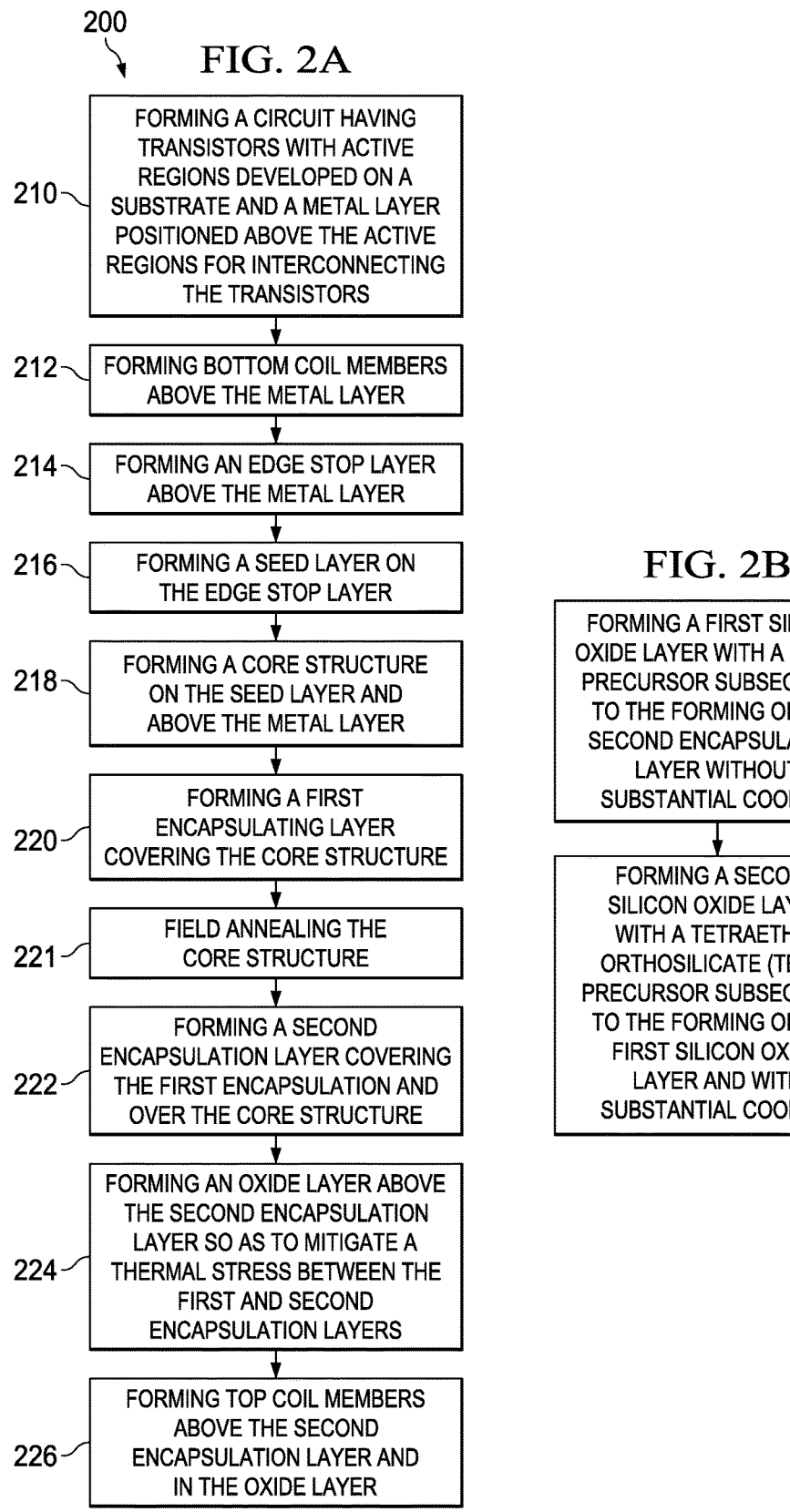

SELECTIVE PATTERNING OF AN INTEGRATED FLUXGATE DEVICE

BACKGROUND

A fluxgate device generally includes a magnetic core structure and coil members coiling around the magnetic core. The fluxgate device can be used for detecting a change in magnetic flux in an environment adjacent to the magnetic core structure. Attempts have been made to interface a fluxgate device with an integrated circuit for adapting to various industrial applications. For instance, a fluxgate device interfaced with a control circuit can be adapted as current measurement devices for use in motor control systems, or as position sensing device for use in robotic systems. However, these solutions are generally costly to implement and complex to operate. Thus, there is a need for a fluxgate device that can be fabricated using a low-cost and high-yield process that is integratable with one or more control circuits.

SUMMARY

The present disclosure describes systems and techniques relating to the fabrication of integrated fluxgate devices. In one aspect, a disclosed integrated fluxgate device includes a first encapsulation layer for shielding a magnetic core structure of the fluxgate and a second encapsulation layer for insulating the shielded magnetic core structure. The first encapsulation layer may include two layers of titanium (Ti) metal sandwiching the magnetic core structure. During the patterning process of the magnetic core structure, a titanium oxide (TiO) layer is formed on the lower titanium layer. As such, the TiO layer interfaces in between the two Ti layers. During a patterning process of the first encapsulation layer, the TiO layer may cause uneven etching of the two Ti layers. Such an uneven etching can lead to the delamination of the Ti layers, thereby reducing the overall yield of the fabrication process. The present disclosure provides an etching process to uniformly etch away the exposed Ti—TiO—Ti stack, so as to avoid delamination and protect the integrity of the magnetic core structure. Advantageously, the disclosed etching process helps prevent one or more corners of the fluxgate device from being shorted or damaged, thereby increasing the overall yield of the fabrication process for integrating the fluxgate device with one or more control circuits.

In one implementation, for example, the present disclosure introduces a method that comprises forming an etch stop layer, a first titanium layer, a magnetic core, a second titanium layer, and patterning the first and second titanium layers. The etch stop layer is formed above a substrate. The first titanium layer is formed on the etch stop layer. The magnetic core is formed on the first titanium layer. The second titanium layer has a first portion encapsulating the magnetic core with the first titanium layer, and a second portion interfacing with the first titanium layer beyond the magnetic core. The patterning of the first and second titanium layers includes forming a mask over a magnetic core region and etching the first and second titanium layers exposed by the mask using a titanium etchant and a titanium oxide etchant.

In another implementation, for example, the present disclosure introduces a method that comprises forming an etch closure layer, a first titanium layer, a magnetic core, a second titanium layer, and patterning the first and second titanium layers. The etch stop layer is formed above a substrate. The first titanium layer is formed on the etch stop layer. The magnetic core is formed on the first titanium layer while the first titanium layer is preserved from being etched. The second titanium layer has a first portion encapsulating the magnetic core with the first titanium layer, and a second portion interfacing with the first titanium layer beyond the magnetic core. The patterning of the first and second titanium layers includes forming a mask over a magnetic core region, and etching the first and second titanium layers exposed by the mask using a titanium etchant and a titanium oxide etchant. The patterning of the first and second titanium layers also includes monitoring a gaseous concentration associated with the etch stop layer, and terminating the etching upon detecting the gaseous concentration reaches a predetermined threshold.

In yet another implementation, for example, the present disclosure introduces a fluxgate device that includes a semiconductor substrate, an etch stop layer, a first titanium layer, a magnetic core, and a second titanium layer. The etch stop layer positioned above the semiconductor substrate. The first titanium layer is positioned on the etch stop layer, and the first titanium layer has a magnetic core region. The magnetic core positioned on the first titanium layer within the magnetic core region. Within the magnetic core region, the second titanium layer encapsulates the magnetic core with the first titanium layer. Beyond the magnetic core region, the second titanium layer interfaces the first titanium layer with a titanium oxide layer.

The present disclosure describes systems and techniques relating to the fabrication of integrated fluxgate devices. In one aspect, a disclosed integrated fluxgate device includes a stress relief structure for mitigating a thermal stress between two or more encapsulation layers covering a magnetic core. Advantageously, the stress relief structure helps prevent one or more corners of the fluxgate device from cracking, thereby increasing the overall yield of a disclosed fabrication process for integrated the fluxgate with one or more control circuits.

DRAWING DESCRIPTIONS

FIG. 2A shows a flow chart of a process for fabricating an integrated fluxgate circuit according to an aspect of the present disclosure.

FIG. 2B shows a flow chart of a process for forming a stress relief layer according to an aspect of the present disclosure.

Like reference symbols in the various drawings indicate like elements. Details of one or more implementations of the present disclosure are set forth in the accompanying drawings and the description below. The figures are not drawn to scale and they are provided merely to illustrate the disclosure. Specific details, relationships, and methods are set forth to provide an understanding of the disclosure. Other features and advantages may be apparent from the description and drawings, and from the claims.

DETAILED DESCRIPTION

Figure 1:
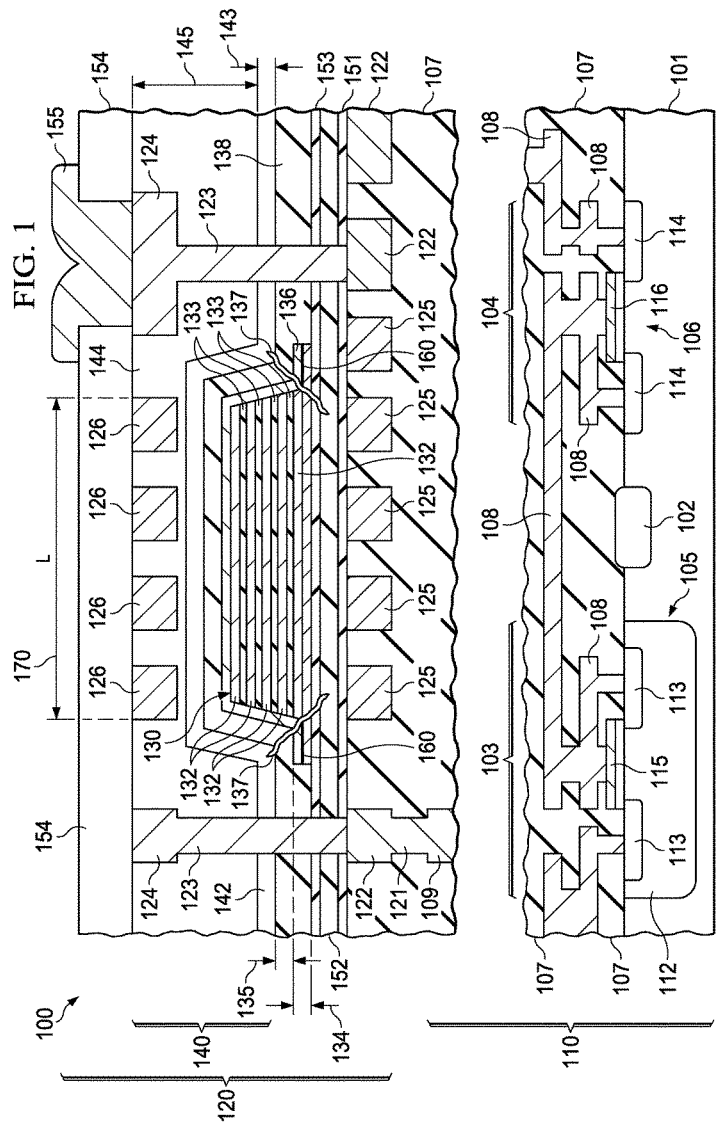
FIG. 1 shows a cross-sectional view of an integrated fluxgate circuit according to an aspect of the present disclosure.

FIG. 1 shows a cross-sectional view of an integrated fluxgate circuit 100 according to an aspect of the present disclosure. The integrated fluxgate circuit 100 includes a circuit 110 and a fluxgate device 120 integrated with the circuit 110 to form a single integrated circuit die. According to an aspect of the present disclosure, the circuit 110 includes one or more control circuits that are coupled to the fluxgate device 120. The circuit 110 can thus be used for controlling the operations of the fluxgate device 120. For instance, the circuit 110 may calibrate the fluxgate device 120 and receive one or more current signals from the fluxgate device 120. Based on the received current signals, the circuit 110 may sense a motion or a position by determining a change in magnetic flux in association with the received current signals. The circuit 110 can be an integrated circuit with two or more transistors formed on a substrate and connected by one or more interconnect wiring layers. In one implementation, for example, the circuit 110 is formed on a substrate 101, which includes a semiconducting material such as silicon. The circuit 110 includes a first transistor 103 and a second transistor 104 formed on the substrate 101.

The first transistor 103 is formed on a first active region 105, whereas the second transistor 104 is formed on a second active region 106. The first transistor 103 can be a p-channel device in that the first active region 105 includes an n-well 112 and a couple of p-doped regions 113 formed in the n-well 112. The p-doped regions 113 serve as the drain and source terminals of the first transistor 103, each of which is coupled to interconnect wiring layers 108. The first transistor 103 includes a gate structure 115 that defines a channel region between the p-doped regions 113. The gate structure 115 is also coupled to the interconnect wiring layers 108.

The second transistor 104 can be an n-channel device in that the second active region 106 is a part of the substrate 101, which can include p-doped materials. The second active region 106 is separated from the first active region by a field oxide element 102, which typically resides in a shallow trench isolation region. The second active region 106 may include a couple of n-doped regions 114, which serve as the drain and source terminals of the second transistor 104. Each of the n-doped region 114 is coupled to the interconnect wiring layers 108. The second transistor 104 includes a gate structure 116 that defines a channel region between the n-doped regions 114. The gate structure 116 is also coupled to the interconnect wiring layers 108.

Although FIG. 1 illustrates two particular types of transistors having active regions arranged in a particular fashion, the circuit 110 may include other types of transistors characterized by different active region arrangements. In one implementation, for example, the circuit 110 may operate under high voltage conditions. As such, the circuit 110 may include lateral diffused metal oxide semiconductor (LDMOS) transistors, which in some arrangements, may include deep trench structures surrounding one or more active regions. In another implementation, for example, the circuit 110 may be fabricated using Bi-CMOS technologies. As such, the circuit 110 may include both CMOS transistors and bipolar junction transistors.

The interconnect wiring layers 108 are separated by several inter-level dielectric (ILD) layers 107. Depending on the complexity of the circuit 110, the number of interconnect wiring layers 108 may vary. Moreover, the interconnect wiring layers 108 includes a top interconnect layer 109 that is directly under and connected to the fluxgate device 120. The interconnect wiring layers 108 may include polysilicon and/or a conductive material such as copper and aluminum.

The interconnect wiring layers 108 are connected using one or more via structures, which can be filled with a conductive material such as tungsten.

The top interconnect layer 109 includes one or more metallic materials such as copper and aluminum. The top interconnect layer 109 may be coupled to the fluxgate device 120 through a first fluxgate metal layer 122 and an inter-device via 121. The fluxgate device 120 is formed above the interconnect wiring layers 108 and the top interconnect layer 109. In general, the fluxgate device 120 includes a set of lower coil members 125, a set of upper coil members 126, and a magnetic core structure 130.

The lower coil members 125 can be formed using the same process as the first fluxgate metal layer 122; whereas the upper coil member 126 can be formed using the same process as a second fluxgate metal layer 124. The second fluxgate metal layer 124 can be connected to the first fluxgate metal layer 122 through an intra-fluxgate via 123. The fluxgate device 120 may include one or more etch stop layers to protect the circuit 110 during the fabrication process of the fluxgate device 120. In one implementation, for example, the fluxgate device 120 includes a first etch stop layer 151 formed above the ILD layer 107, a dielectric layer 152 formed on the first etch stop layer 152, and a second etch stop layer 153 formed on the dielectric layer 152. Each of the layers 151, 152, and 153 may also serve as an insulation layer for insulating the fluxgate device 120 from the circuit 110. The first and second etch stop layers 151 and 153 may include a nitride material such as silicon nitride. The dielectric layer 152 may include an oxide material such as silicon oxide.

The magnetic core structure 130 is formed above the top interconnect metal layer 109 and thus defines a plateau protruding above the top interconnect metal layer 109. The magnetic core structure 130 includes multiple magnetic layers 132 interleaving with multiple insulating layers 133. In one implementation, each of the magnetic layers 132 may include a cobalt alloy. In another implementation, each of the magnetic layers 132 includes a nickel iron (NiFe) alloy. More specifically, each of the magnetic layers 132 may include a weight ratio of about 80% nickel to 20% iron. For example, the magnetic layers 132 may include 82 weight percent of nickel and 18 weight percent of iron. And each of the magnetic layers 132 may have a thickness of 3,350 Å. The insulating layers 133 serve to insulate the magnetic layers 132 from one another. In one implementation, each of the insulating layers 133 includes an aluminum nitride (AlN) material. And each of the insulating layers 133 may have a thickness of 70 Å.

The magnetic core structure 130 is protected by the first encapsulation layer 136 and the second encapsulation layer 138. The first encapsulation layer 136 has a bottom portion serves as a seed layer for developing the magnetic core structure 130. The bottom portion of the first encapsulation layer 136 is insulated from the top interconnect metal layer 122 by an insulation layer such as layers 151, 152, and 153. The first encapsulation layer 136 also includes a top portion to cover and protect the magnetic core structure 130. The first encapsulation layer 136 defines a magnetic core region 170 for positioning the magnetic core structure 130. The first encapsulation layer 136 includes a metallic material that is suitable for developing the magnetic core structure 130 thereon and for protecting the magnetic core structure 130 thereunder from various types of process stress. In one implementation, for example, the first encapsulation layer 136 includes a titanium (Ti) metal, which has a relatively high thermal expansion coefficient (e.g., at about $8.6 \times 10E-6$ m/K).

Due to the oxidation of the Ti metal, the first encapsulation layer 136 includes a titanium oxide (TiO) layer 160 interfaces between the top and bottom portions of the first encapsulation layer 136. The first encapsulation layer 136 is formed after the top and bottom Ti layers as well as the middle TiO layer 160 are patterned and etched. The present disclosure introduces an etching process to preserve the integrity of the Ti—TiO—Ti stack (i.e., the bottom corner edges of the first encapsulation layer 136) along the periphery of the first encapsulation layer 136. This etching process is disclosed in greater details with the description of FIGS. 2C and 3C-3F. The disclosed etching process helps prevent delamination around the corners of the first encapsulation layer 136, which allows the magnetic core structure 130 to be properly shielded and protected. A semiconductor wafer for manufacturing the integrated fluxgate circuit 100 is shown to have a high yield where the disclosed etching process is implemented.

The second encapsulation layer 138 protects and insulates the first encapsulation layer 136. The second encapsulation layer 138 includes a top portion that covers the first encapsulation layer 136. The second encapsulation layer 138 also includes a bottom portion on which the first encapsulation layer 136 is formed. In one implementation, for example, the bottom portion of the second encapsulation layer 138 can be the second etch stop layer 153. In another implementation, for example, the bottom portion of the second encapsulation layer 138 may include an insulation layer (not shown) formed between the second etch stop layer 153 and the bottom portion of the first encapsulation layer 136. The second encapsulation 138 includes a material that is suitable for insulating the first encapsulation layer 136 and protecting the first encapsulation layer 136 from one or more etching process. In one implementation, for example, the second encapsulation layer 138 includes a nitride material (e.g., silicon nitride), which has a relatively low thermal expansion coefficient (e.g., ranges from $1.47 \times 10E-6$ m/K to $3.7 \times 10E-6$ m/K) when compared to the thermal expansion coefficient of the first encapsulation layer 136.

Due to the difference in thermal expansion coefficients between the first encapsulation layer 136 and the second encapsulation layer 138, these two layers may experience a significant thermal mechanical stress when there is a substantial temperature change during the fabrication process. In particular, one of these two layers may expand or contract at a much higher rate than the other layer. As a result of this thermal mechanical stress, the integrated fluxgate circuit 100 may experience cracking along crack lines 137 surrounding the bottom corners of the magnetic core structure 130. The severity of these crack lines 137 depends on a few factors. One factor includes the longitudinal size (L) of the magnetic core structure 130. In general, the longitudinal size (L) of the magnetic core structure 130 can be understood as the greater one of the longitudinal length or longitudinal width of the magnetic core structure 130. In one implementation, for example, the magnetic core structure 130 may have a longitudinal width of 100 um, a longitudinal length of 1,450 um, and a thickness of 1.73 um. Then, the longitudinal size (L) of the magnetic core structure 130 can be 1,450 um.

The relatively large longitudinal size (L) of the magnetic core structure 130 creates a specific problem not presented in conventional integrated circuits. This relatively large longitudinal size (L) exacerbates the thermal mechanical stress between the first encapsulation layer 136 and the second encapsulation layer 138. In particular, the second encapsulation layer 138 may be formed under high temperature (e.g., 400° C.), and the fabrication process may involve substantial cooling before the integrated fluxgate circuit 100 undergoes the next process step. The substantial cooling can be attributed to switching of process chambers, transportation of wafers, and/or process tool preparation time. In any event, the substantial cooling may range from a 150° C. drop to more than a 200° C. drop.

This substantial drop of process temperature causes the first encapsulation layer 136 to contract at a significantly different pace from the second encapsulation layer 138. In the event that the first encapsulation layer 136 includes a titanium material and the second encapsulation layer 138 includes a nitride material, the first encapsulation layer 136 will contract at a much faster pace than the second encapsulation layer 138 when there is a substantial cooling. As a result, the first and second encapsulation layers 136 and 138 will experience a thermal mechanical stress asserted in between them. This thermal mechanical stress is heightened especially when the magnetic core structure 130 includes a material (e.g., NiFe) with a thermal expansion coefficient that is even higher than that of the first encapsulation layer 136. When the thermal mechanical stress is high enough, the first and second encapsulation layers 136 and 138 may crack along the crack lines 137. These crack lines 137 may extend downward to the circuit 110, which may impact the structural integrity of the interconnect wiring layers 108.

The present disclosure provides a cost efficient solution to mitigate the thermal mechanical stress between the first and second encapsulation layers 136 and 138, and any other structures for protecting and/or insulating the magnetic core structure 130. The disclosed solution includes a stress relief structure formed above the second encapsulation layer 138. According to one aspect of the solution, the disclosed stress relief structure has a thermal expansion coefficient that is lower than that of the second encapsulation layer 138. According to another aspect of the solution, the disclosed stress relief structure covers the second encapsulation layer 138 and has a thickness that is within the same magnitude as the thickness of the second encapsulation layer 138. According to yet another aspect of the solution, the disclosed stress relief structure is formed shortly after the second encapsulation layer 138 is formed and within similar temperature ranges as the second encapsulation layer 138 is formed. To that end, the disclosed stress relief structure is formed without the substantially cooling of the second encapsulation layer 138 after the second encapsulation layer 138 is formed.

In one implementation, for instance, the disclosed stress relief structure includes an oxide layer 140 formed above the second encapsulation layer 138. In general, the oxide layer 140 may have a thermal expansion coefficient of about $5.6 \times 10E-7$ m/V, which is lower than that of the second encapsulation layer 138. The oxide layer 140 includes an oxide thickness (e.g., 143, or 143 in combination with 145) that is sufficient to mitigate the thermal mechanical stress (hereinafter "thermal stress") between the first and second encapsulation layers 136 and 138. The entire oxide layer 140 may be formed without substantial cooling after the second encapsulation layer 138 is formed. Alternatively, a lower portion (e.g., a first oxide layer 142) of the oxide layer 140 can be formed without substantial cooling while an upper portion (e.g., a second oxide layer 144) of the oxide layer 140 can be formed with substantial cooling.

To avoid substantial cooling of the second encapsulation layer 138, the oxide layer 140 can be formed using the same tool that forms the second encapsulation layer 138. For example, a plasma-enhanced chemical vapor deposition (PECVD) tool can be used for depositing the oxide layer 140 shortly after depositing the second encapsulation layer 138. To efficiently protect the encapsulation layers (e.g., 136 and/or 38) from cracking around the magnetic core structure 130, the oxide layer 130 may have a minimum thickness 143 that is sufficient to mitigate the thermal stress between the encapsulation layers. In one implementation, the minimum thickness 143 of the oxide layer 140 can be based upon a stress ratio of the thermal stress associated with the longitudinal size (L) of the magnetic core structure 130. The minimum oxide thickness 143 thus correlates to the stress ratio according to this aspect of the disclosure. More specifically, the minimum oxide thickness 143 can be directly proportional to the stress ratio. That is, the higher the stress ratio, the greater the minimum oxide thickness 143. The stress ration can be defined by the encapsulation thickness (e.g., the first encapsulation thickness 134 and the second encapsulation thickness), the longitudinal size (L), and the thermal expansion coefficients of the respective encapsulation layers vis-a-vis the magnetic core structure 130.

For instance, where the second encapsulation layer 138 includes a nitride material with an encapsulation thickness 135, the minimum oxide thickness 143 of the oxide layer 140 can be at least 85% of the encapsulation thickness 135. More specifically, where the second encapsulation layer 138 includes a silicon nitride with a thickness of 4,700 Å, the minimum oxide thickness 143 of the oxide layer 140 can be 4,000 Å or more in order to preserve a crack-free encapsulation layer (e.g., 136 or 138).

To streamline the fabrication process, the process time for forming the second encapsulation layer 138 and the oxide layer 140 may be roughly the same so as to avoid substantial cooling of the second encapsulation layer 138 while allowing the minimum oxide thickness 143 to be developed. This process time allocation may lead to a relatively equal distribution of thickness between the second encapsulation layer 138 and a first oxide layer 142 (e.g., the lower portion of the oxide layer 140). To further reinforce the first oxide layer 142, a second oxide layer 144 (e.g., the upper portion of the oxide layer 140) may be formed on top of the first oxide layer 142. Because the first oxide layer 142 likely provides a sufficient amount of thermal stress relief to the encapsulation layer (e.g., the first and second encapsulation layers 136 and 138), the second oxide layer 144 may be formed after the encapsulation layers undergo substantial cooling. That is, the second oxide layer 144 may be formed with a process tool that is different from the process tool that forms the second encapsulation layer 138. Moreover, the second oxide layer 144 may include a second oxide thickness 145 in addition to the first oxide thickness (i.e., the minimum oxide thickness) 143.

In one implementation, the first oxide layer 142 may include a first silicon oxide material formed from a silane ($SiH_4$) precursor. The first oxide layer 142 generally conforms to a plateau contour defined by the magnetic core structure 130 because silane-based silicon oxide typically has good uniformity. The second oxide layer 144 may include a second silicon oxide material formed from a tetraethyl orthosilicate (TEOS) precursor, and the second oxide layer 144 is positioned above the first oxide layer 142. After a planarization process, the second oxide layer 144 generally conforms to a surface of the substrate 101. Then, a passivation layer 154 is formed above the oxide layer 140 for protecting the underlying circuitry. The passivation layer 154 defines one or more openings for depositing one or more bond pads 155.

FIG. 2A shows a flow chart of a process 200 for fabricating an integrated fluxgate circuit according to an aspect of the present disclosure. The process 200 may begin at step 210, which includes forming a circuit (e.g., the circuit 110) with active regions (e.g., active regions 105 and 106) developed on a substrate (e.g., the substrate 101). Step 210 also includes forming a metal layer (e.g., the interconnect wiring layers 108 and the top interconnect layer 109) that positioned above the active regions for interconnecting the transistors (e.g., the PMOS 103 and the NMOS 104) formed thereunder.

Figure 3A:
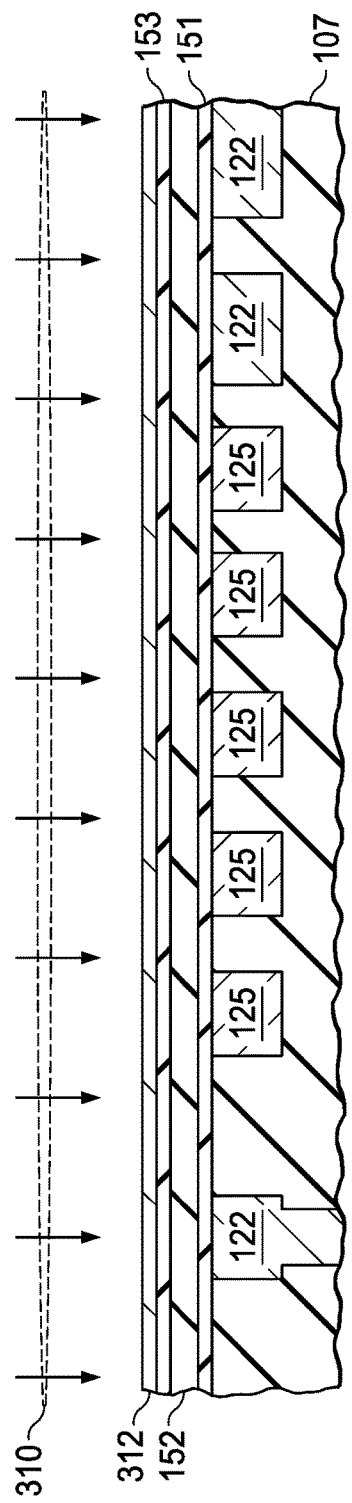
FIGS. 3A-3J show cross-sectional views of an integrated fluxgate circuit during a fabrication process according to an aspect of the present disclosure.

Step 212 includes forming bottom coil members (e.g., the bottom coil members 125) above the metal layer. Step 214 includes forming an edge stop layer (e.g., the second edge stop layer 153) above the metal layer. Step 216 includes forming a seed layer on the edge stop layer. FIG. 3A shows a cross sectional view of an integrated fluxgate device (e.g., 120) when step 216 is performed. A seed layer deposition 310 is performed using a target material to form a seed layer 312. In one implementation, the seed layer deposition 310 includes a physical vapor deposition, which can be plasma-enhanced (i.e., PEPVD), using titanium as a target material. Consequently, a titanium (Ti) seed layer 312 is formed on the second etch stop layer 153, and the seed layer 312 may incur a thickness of 300 Å. The Ti seed layer 312 is a first titanium layer, which is preserved from being etching until after the second titanium layer is formed (see, e.g., FIGS. 3B-3E).

Figure 3B:
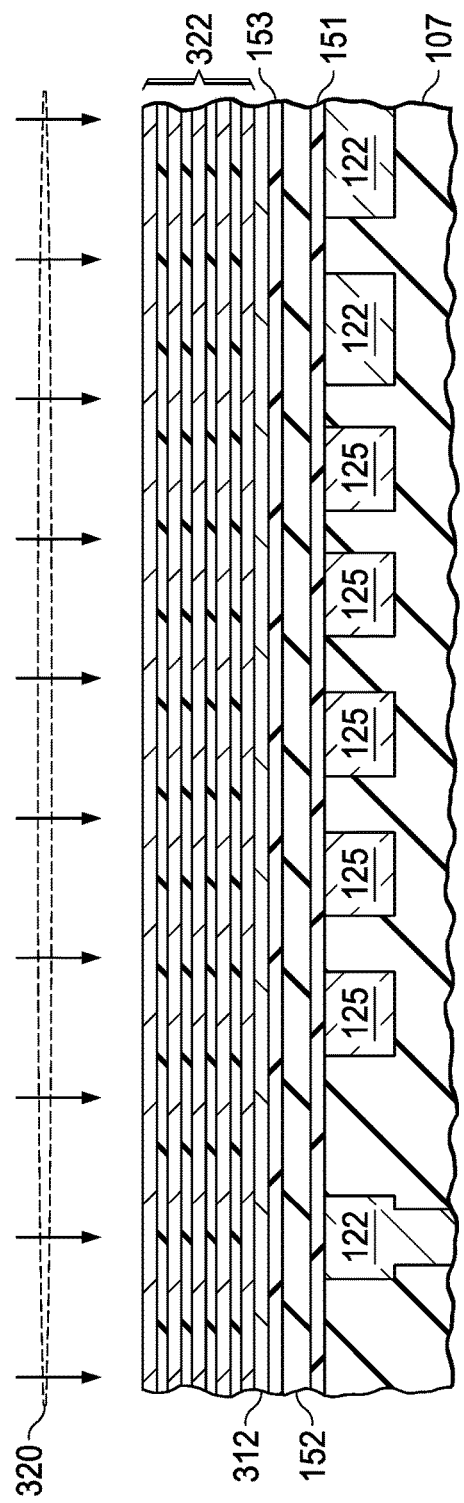
Figure 3C:
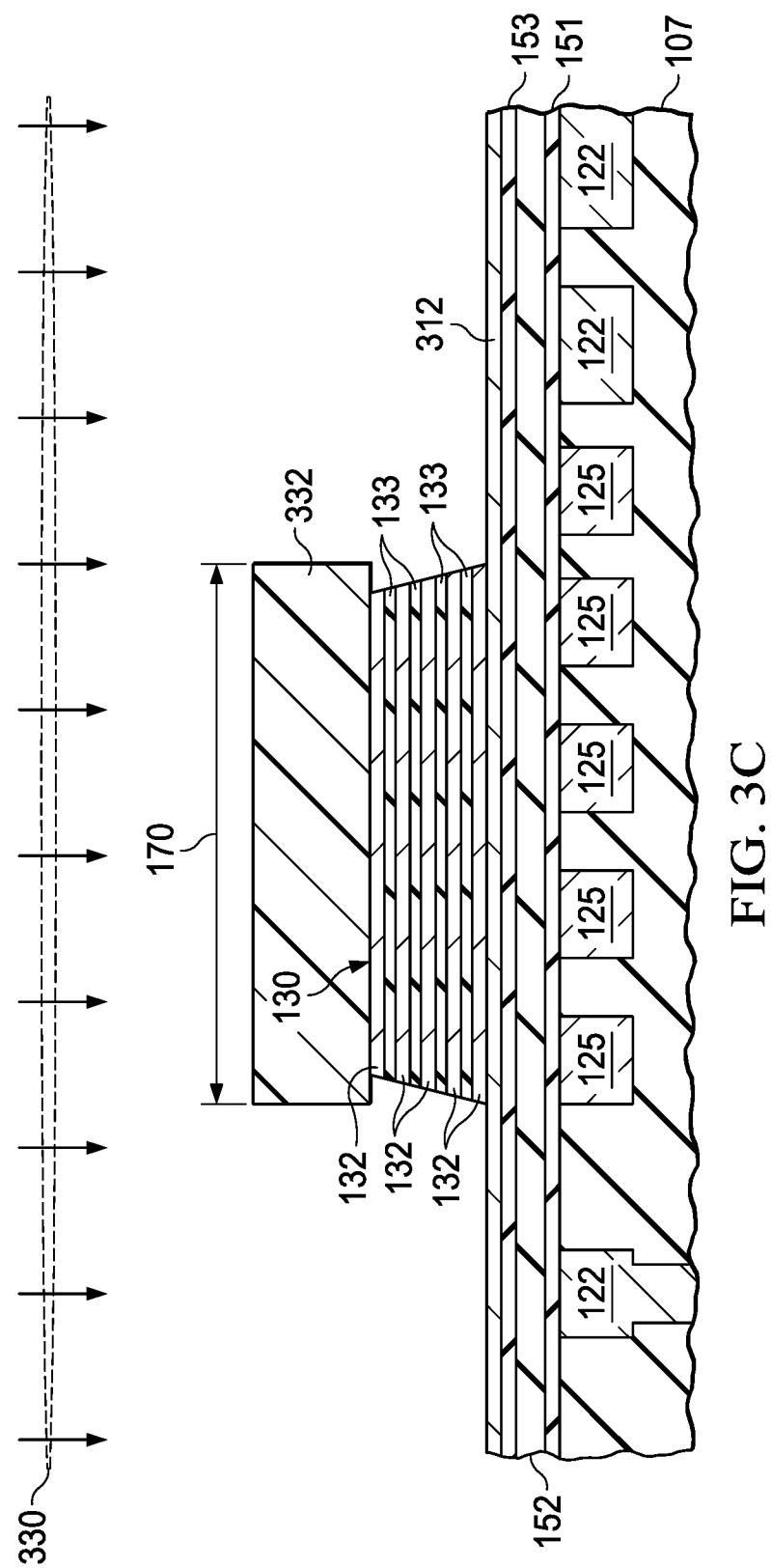

Next, the process 200 proceeds to step 218, which includes forming a core structure (e.g., the magnetic core structure 130) on the seed layer 312 and above the metal layer (e.g., the interconnect wiring layers 108 and the top interconnect layer 109). FIGS. 3B-3C shows cross sectional views of an integrated fluxgate device (e.g., 120) when step 218 is performed. Referring to FIG. 3B, a magnetic core deposition process 320 is performed to deposit interleaving magnetic layers and insulation layers. The magnetic core deposition process 320 includes the physical vapor deposition of the magnetic layers (e.g., 132) alternating with the chemical vapor deposition of the insulation layers (e.g., 133). Each magnetic layer may include a nickel iron alloy with a weight ratio of about 82% nickel to 18% iron and an average thickness of 3,350 Å. Though other weight ratios can be used, this particular weight ratio provides high permeability and high sensitivity, and it also lowers the saturation magnetization and operating current of the fluxgate device (e.g., 120). Moreover, this particular weight ratio may lower coercivity and magnetostriction, which leads to a lower noise figure. Each insulation layer may include an aluminum nitride compound with an average thickness of 70 Å. The insulation layers provide lamination to the magnetic layers. This lamination feature prevents degradation of magnetic properties with increasing thickness of the core structure. Moreover, this lamination feature reduces eddy current loss during operation. The physical vapor deposition and the chemical vapor deposition can be plasma-enhanced in one implementation. As a result of the magnetic core deposition process 320, a magnetic core layer 322 is formed.

Referring to FIG. 3C, a magnetic core patterning process 330 is performed to refine the horizontal (or planar) dimensions of a magnetic core structure 130, such that the magnetic core structure is positioned within the magnetic core region 170. As a result of a photolithography process, a photoresist mask 332 is formed on the magnetic core layer 322 overlapping the magnetic core region 170. The magnetic core patterning process 330 includes etching away a portion of the magnetic core layer 322 that is not protected under the photoresist mask 332. As a result of the etching, the magnetic core structure 130 is formed. In one implementation, for instance, the etching process can be a wet etch using diluted acid, such as phosphoric acid, citric acid, and/or nitric acid. The wet etch is isotropic and selective. As such, the wet etch can be stopped at the titanium seed layer 312.

Figure 3D:
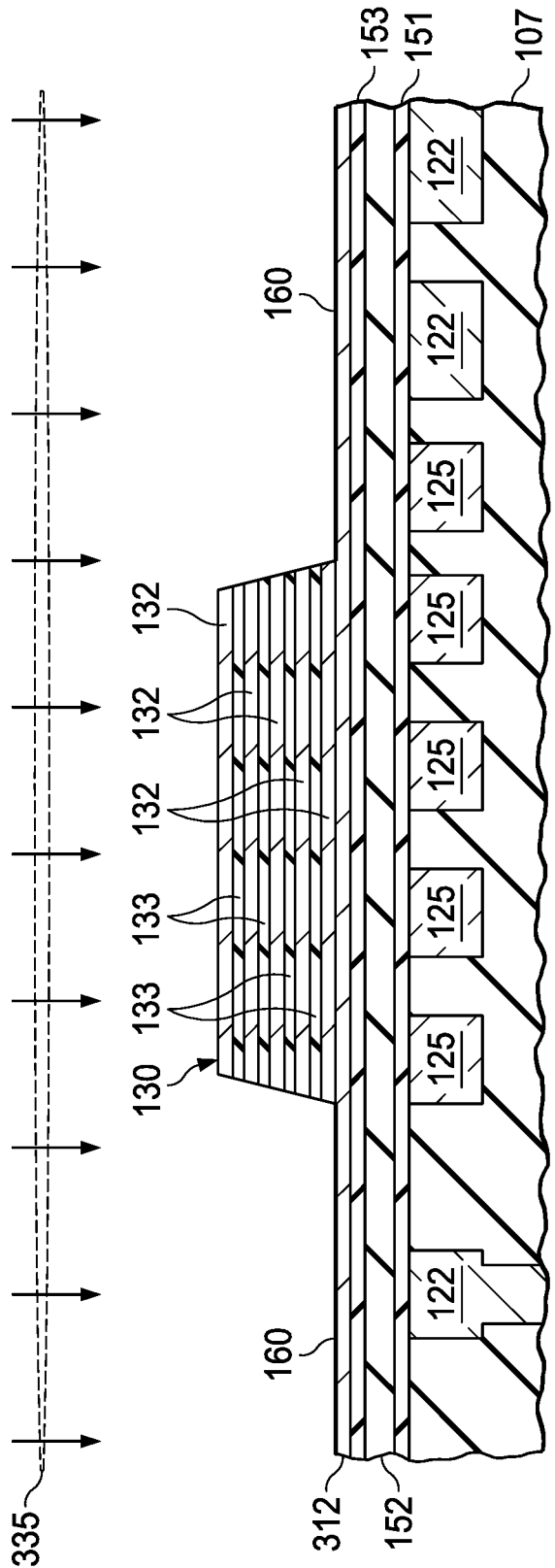

After the magnetic core structure 130 is formed, step 218 includes an ashing process 335 to remove the photoresist mask 332 as shown in FIG. 3D. The ashing process 335 may introduce hot oxygen into the process chamber. As such, a titanium oxide (TiO) layer 160 is formed directly on top of the titanium (Ti) seed layer (i.e., the first Ti layer) 312. The Ti seed layer 312 is preserved from being etched during the magnetic core patterning process 330 and the ashing process 335.

Figure 2C:
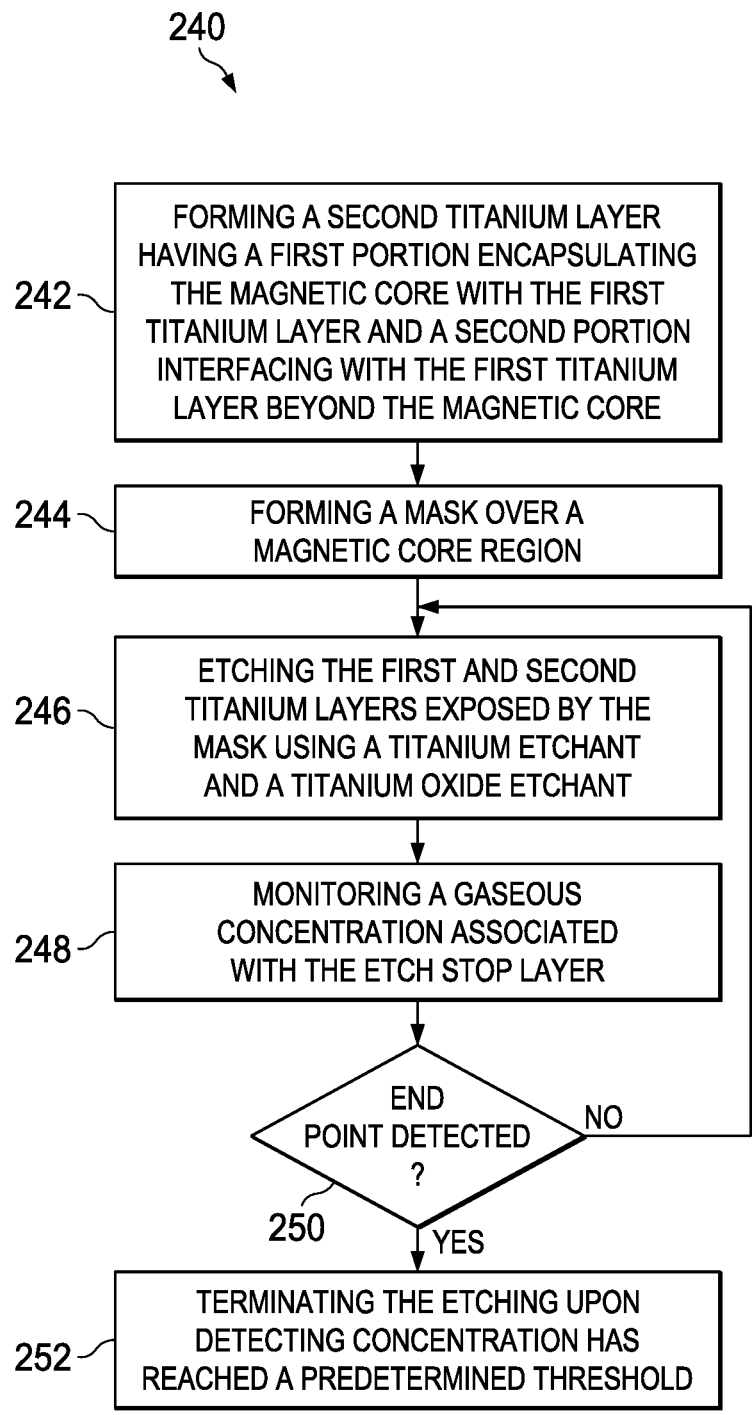
FIG. 2C shows a flow chart of a process for forming an encapsulation layer according to an aspect of the present disclosure.
Figure 3E:
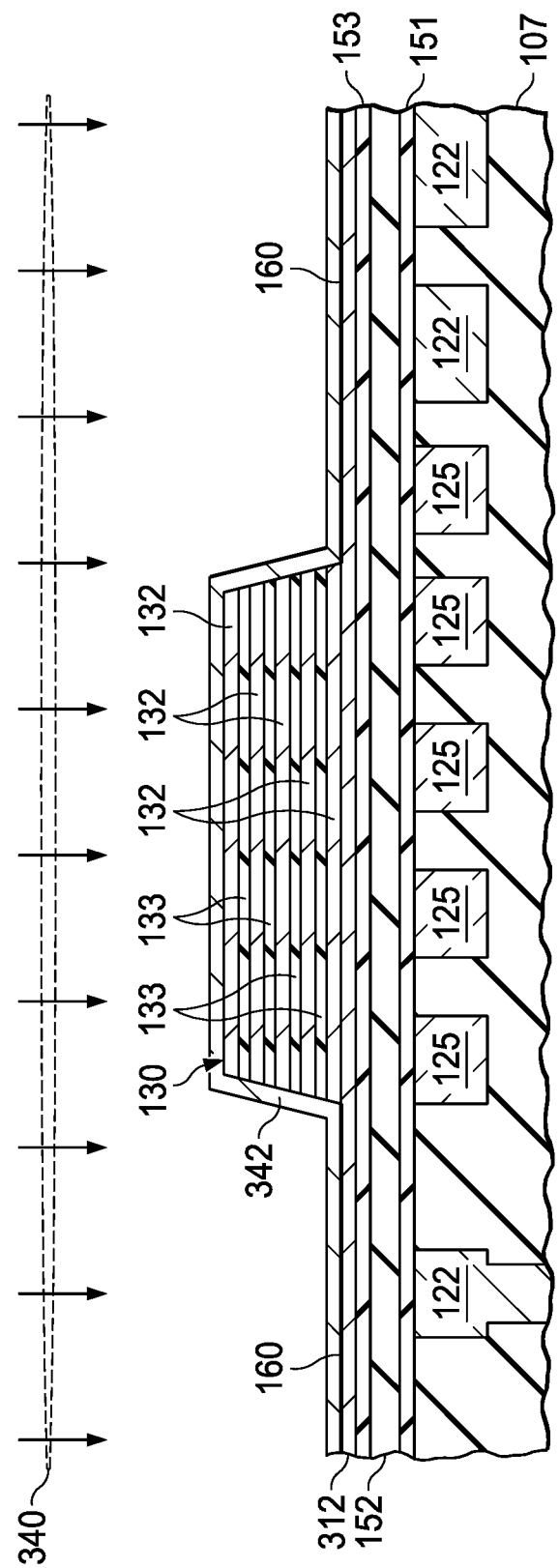
Figure 3F:
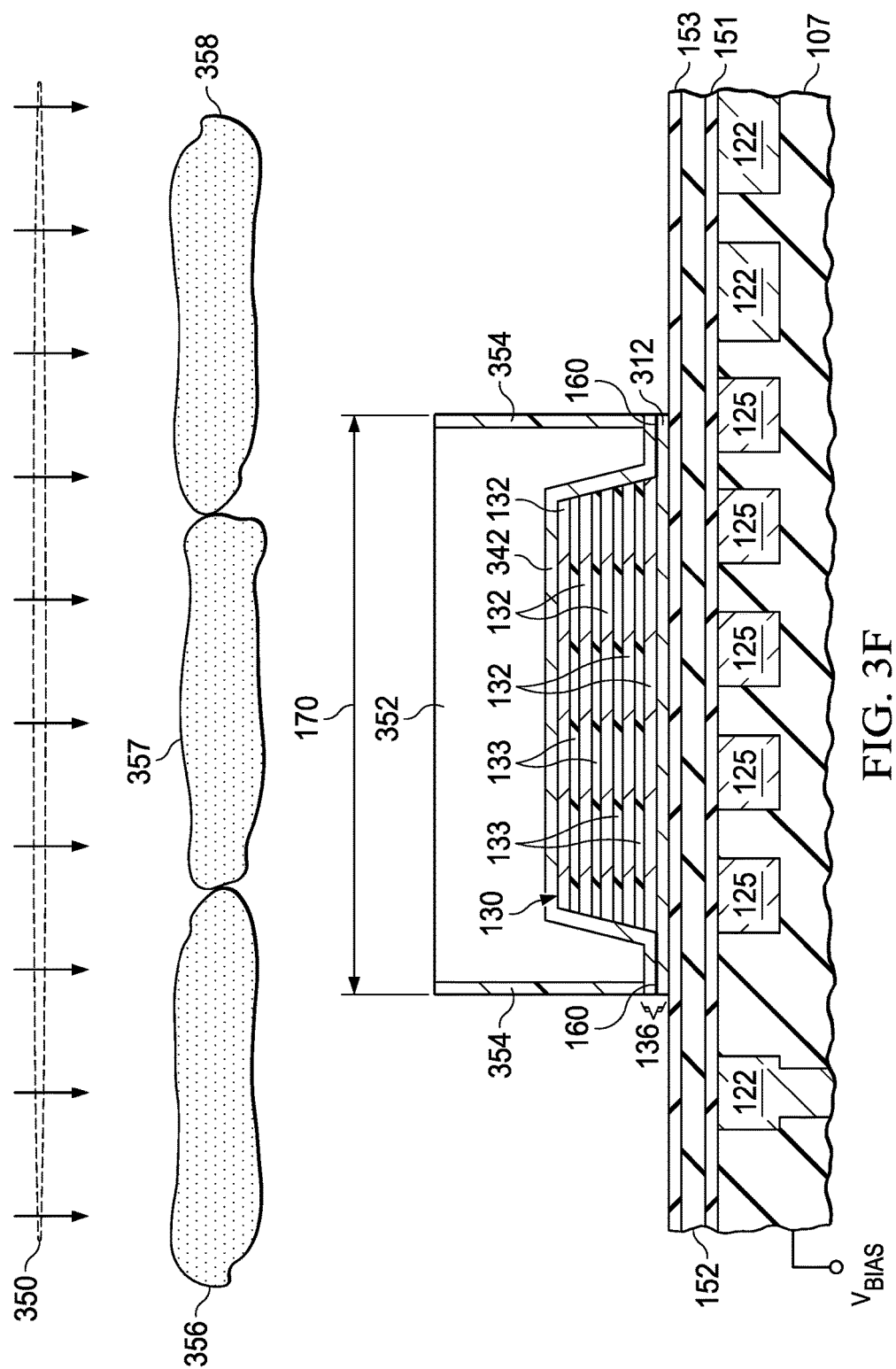

Next, the process 200 proceeds to step 220, which includes forming a first encapsulation layer (e.g., 136) covering the core structure (e.g., 130). FIGS. 3E-3F shows cross sectional views of an integrated fluxgate device (e.g., 120) when step 220 is performed. According to an aspect of the present disclosure, step 220 may be implemented by a process 240 as shown in FIG. 2C and consistent with the illustrations of FIGS. 3E-3F. The process 240 begins at step 242, which involves forming a second titanium layer 342 as shown in FIG. 3E. During step 242, a titanium deposition 340 is performed to deposit the second titanium layer 342, which forms the top portion of the first encapsulation layer (e.g., 136). In one implementation, the titanium deposition 340 includes a physical vapor deposition, which can be plasma-enhanced (i.e., PEPVD), using titanium as a target material. The second titanium layer 342 may incur a thickness of 1,350 Å. Having a titanium oxide layer 160 formed in between, the second titanium layer 342 bonds with the first titanium layer (i.e., the seed layer) 312 to form the first encapsulation layer (e.g., 136). More specifically, the second titanium layer 342 includes a first portion and a second portion. The first portion encapsulates the magnetic core structure 130 with the first titanium layer 312. The second portion interfaces with the first titanium layer 312 beyond the magnetic core region 170.

Upon completing step 241, the process 240 proceeds to step 244, which involves forming a mask over a magnetic core region. Referring to FIG. 3F, a mask 352 is formed over the magnetic core region 170 and on top of the second titanium layer 342. The mask 352 can be a photoresist mask that includes carbon-based materials. After the mask 352 is formed, the process 240 proceeds to step 246, which involves etching the first and second titanium layers exposed by the mask using a titanium etchant and a titanium oxide etchant. Referring again to FIG. 3F, an etching process 350 is performed to refine the horizontal (or planar) dimensions of first encapsulation layer 136.

According to an aspect of the present disclosure, the etching process 350 can be a dry etch using plasmas formed by a titanium etchant and a titanium oxide etchant. For example, the etching process 350 can be a reactive ion etching (ME) performed inside of an RIE chamber. The etching process 350 removes a stack of titanium based metal and metal oxide (i.e., a Ti—TiO—Ti stack) around the bottom corner edges of the first encapsulation layer 136 and outside of the magnetic core region 170. To prevent corrosion of the magnetic core structure 130 and delamination of the Ti—TiO—Ti stack, the etching process 350 is performed with a high etch rate and in a uniform manner. Conventional titanium etchants may be used for etching the titanium oxide layer 160, though the etch rate of these conventional titanium etchant is generally lower when they are applied to titanium oxide material than when they are applied to titanium material. Thus, conventional titanium etchants may introduced uneven etching across the Ti—TiO—Ti stack, and they may also lower the overall etch rate.

The etching process 350 deploys both a titanium etchant and a titanium oxide etchant to promote uniform etching, which can be performed at a high etch rate. The titanium etchant includes a first compound that removes titanium at a high rate. In one implementation, for example, the titanium etchant may also include a chlorine ($Cl_2$) gas to form a $Cl_2$ plasma 356. The titanium etchant also includes a second compound that remove titanium while forming a protection sidewall with the mask 352. The protection sidewall helps prevent corrosion of the magnetic core structure 130. In one implementation, for example, the titanium etchant may include a boron trichloride ($BCL_3$) gas to form a $BCL_3$ plasma 357. During the etching process 350, the boron particles in the $BCL_3$ plasma 357 form a boron-carbon polymer (BCP) sidewall 354 laterally surrounding the exterior of the magnetic core structure 130. The BCP sidewall 354 protects the first encapsulation layer 136 and the magnetic core structure 130 from lateral etching. More specifically, the BCP sidewall 354 protects the first portion (i.e., within the magnetic core region 170) of the second titanium layer 342, while the second portion (i.e., outside of the magnetic core region 170) of the second titanium layer 342 is etched.

The etching process 350 adopts a titanium etchant ratio of the $BCL_3$ plasma 357 to the $Cl_2$ plasma 356 in order to promote uniform etching and preserve the integrity of the magnetic core structure 130 and the first encapsulation layer 136. In one implementation, for example, the titanium etchant ratio ranges from two-third (⅔) to two (2). In another implementation, for example, the titanium etchant ratio is equal to or greater than two (2). The titanium etchant ratio may be implemented by controlling the inflow of a $BCL_3$ gas at 70 standard cubic centimeters per minute (sccm) and the inflow of a $Cl_2$ gas at 35 sccm. The 70-sccm-$BCL_3$ to 35-sccm-$CL_2$ gas inflow ratio can be modified by a fraction (e.g., 14 sccm to 7 sccm) or a multiplier (e.g., 140 sccm to 70 sccm) depending on the conditions of the etching process 350.

The disclosed ranges of the titanium etchant ratio allow the bias voltage ($V_{BIAS}$) of the etching process 350 to be lowered in order to reduce the amount of physical etching of the Ti—TiO—Ti stack. In general, the bias voltage may be applied to the wafer embodying the integrated fluxgate circuit 100. The bias voltage promotes ion bombardments onto the wafer surface, thereby facilitating the physical etching of the Ti—TiO—Ti stack. Moreover, the physical etching may extend to the etch stop layer 153 because unlike chemical etching, physical etching is non-selective. The etching process 350 is generally end point driven and based on a detection of a chemical released from the etch stop layer 153. The etching of the etch stop layer 153 may be premature where there are portions of the Ti—TiO—Ti stack remained unetched. Moreover, premature etching of the etch stop layer 153 may deprive further processes from relying on an etch stop layer 153 having a sufficient thickness to protect the underlying circuit 110 (as shown in FIG. 1). By reducing the amount of physical etching, the etching process 350 can maintain a relatively high chemical etch rate of the Ti—TiO—Ti stack while preventing (A) the underlying etch stop layer 153 from being over-etched and (B) the premature detection of an etch-stop end point.

Moreover, by reducing the amount of physical etching, the etching process 350 may be performed more uniformly and gently across the Ti—TiO—Ti stack. Advantageously, a uniform and gentle etching of the Ti—TiO—Ti stack prevents the delamination of the first encapsulation layer 136, which in turn protects the integrity of the magnetic core structure 130. The titanium oxide etchant can be used to compensate the reduction of physical etching. The titanium oxide etchant also supplements the titanium etchants (e.g., the $Cl_2$ plasma 356 and the $BCL_3$ plasma 357) in enhancing the etch rate of the titanium oxide layer 160. In one implementation, for example, the titanium oxide etchant may include a trifluoromethane ($CHF_3$) gas to form a $CHF_3$ plasma 358. With the help of the titanium oxide etchant, the titanium oxide layer 160 can be etched at about the same rate as the first and second titanium layers 312 and 342. A relatively uniform etch rate across the Ti—TiO—Ti stack allows the etched front of the titanium oxide layer 160 to stay in close range with the first and second titanium layers 312 and 314. Thus, a relatively uniform etch rate across the Ti—TiO—Ti stack prevents any one of the stack layers from delaminating.

Where the disclosed ranges of titanium etchant ratio is applied and where the $CHF_3$ plasma 358 is deployed, the bias voltage ($V_{BIAS}$) can be lowered from its typical range of 120V-150V. In one implementation, for example, the bias voltage can be less than 120V. In another implementation, for example, the bias voltage can be less than 100V. In yet another implementation, for example, the bias voltage can be 75V.

Referring again to FIG. 2C, step 248 may be performed after the commencement of, or concurrent with, step 246. Step 248 involves monitoring a gaseous concentration associated with the etch stop layer (e.g., 153). The monitoring can be performed continuously or periodically. In an implementation where the etch stop layer 153 includes a nitride material, step 248 can be performed by monitoring a nitride wavelength associated with the etching of the etch stop layer 153. In step 250, a determination is made regarding whether an etch-stop end point is detected based on the monitoring result of step 248. The etch-stop end point is reached when the gaseous concentration reaches a predetermined threshold. If the etch-stop end point is not detected, the process 240 may continuously perform step 246 and step 248. If the etch-stop end point is detected, the process 240 will proceed to step 252, which involves terminating the process 240. This also concludes step 220 of the process 200, the end result of which is illustrated in FIG. 3F. Subsequently, the mask 352 is removed by ashing with an oxygen gas, which helps prevent the delamination of the magnetic core structure 130.

Upon completing the formation of the first encapsulation layer 136, the process 200 proceeds to step 221, which includes performing field annealing of the core magnetic structure 130. During the field annealing process, the core magnetic structure 130 is placed under a permanent magnet at around 370° C. and for about 60 minutes. The permanent magnet is of substantial weight (e.g., 4 tons) such that the field annealing process may help improve the magnetic alignment process to achieve better uniformity across the wafer on which the integrated fluxgate circuit 100 is formed.

Figure 3G:
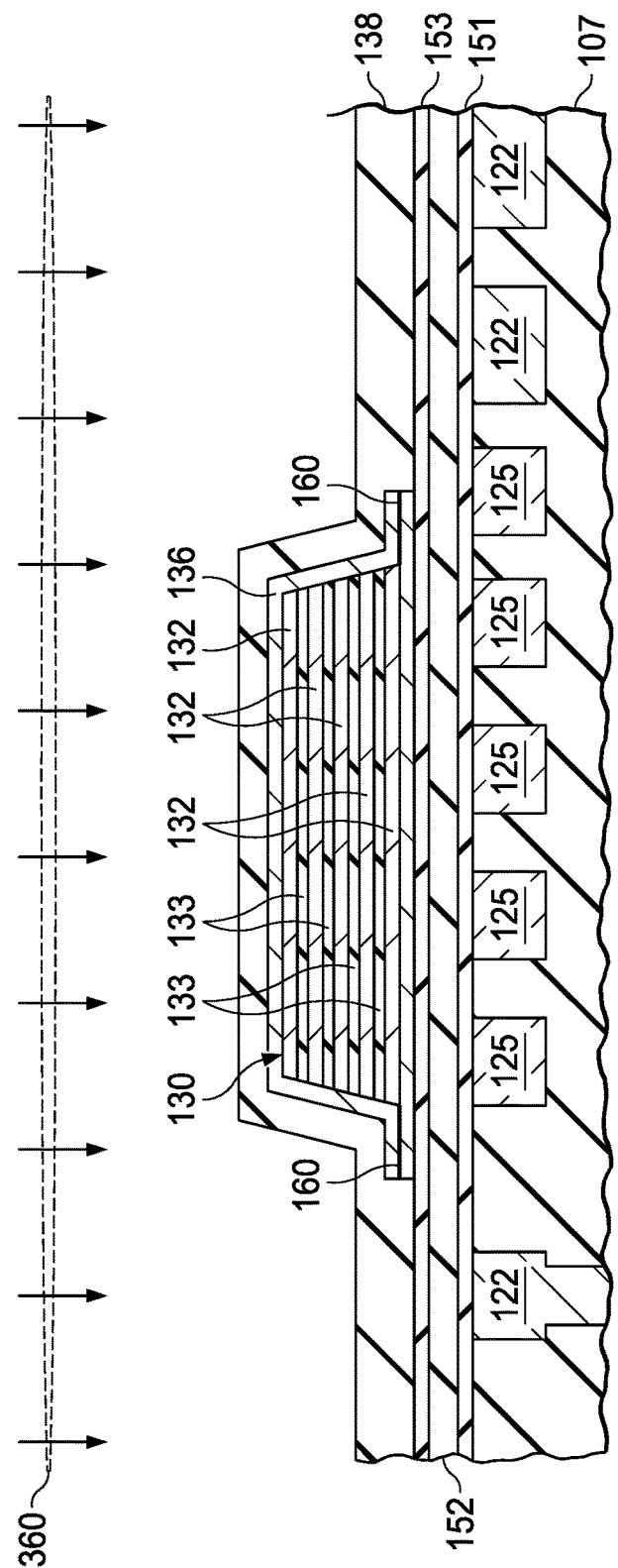

Next, the process 200 proceeds to step 222, which includes forming a second encapsulation layer (e.g., 138) covering the first encapsulation layer (e.g., 136) and over the core structure (e.g., 130). FIG. 3G shows a cross sectional view of an integrated fluxgate device (e.g., 120) when step 222 is performed. A second encapsulation layer deposition 360 is performed to deposit the second encapsulation layer 138. In one implementation, the second encapsulation layer deposition 360 includes using a chemical vapor deposition (CVD) tool, which can be plasma-enhanced (i.e., PECVD). The deposition 360 is performed in a chamber at a first CVD temperature around 400° C. and using silane ($SiH_4$) and nitrogen (N) as precursors. After a first deposition duration, the second encapsulation layer 138 includes a silicon nitride (SiN) material, which may have a thickness of 4,700 Å. Although the second encapsulation layer 138 can be further developed to have a greater thickness, it is advantageous to refrain from doing so in some cases. This is because depositing a silicon nitride layer is generally costly and difficult to control. And a prolonged silicon nitride deposition can produce more polymer byproducts that may impact the functionality of the fluxgate device 120. During the deposition 360, the second encapsulation layer 138 may bond with the second etch stop layer 153 to form a single encapsulation structure for insulating and protecting the magnetic core structure 130 inside of the first encapsulation layer 136.

After the second encapsulation layer deposition 360 is performed, the wafer containing the integrated fluxgate circuit 100 is transferred to another chamber while the CVD tool is being prepared for oxide deposition. To minimize the thermal stress asserted between the first and second encapsulation layers 136 and 138, or asserted by the magnetic core structure 130, the wafer may be kept near the first CVD temperature before the oxide layer (e.g., 140) is deposited. Thus, the wafer may be kept at a pre-CVD temperature that is not substantially below the first CVD temperature. In one implementation, for example, the pre-CVD temperature may be maintained at no lower than 250° C. where the first CVD temperature is at around 400° C.

In step 224, an oxide layer (e.g., 142 and/or 144) is formed above the second encapsulation layer 138 so as to mitigate a thermal stress between the first and second encapsulation layers 136 and 138. According to an aspect of the disclosure, the oxide layer has an oxide thickness (e.g., 143, or 143 in combination with 145) that is sufficient to mitigate a thermal stress between the first and second encapsulation layers 136 and 138. The oxide layer can be deposited using the same CVD tool as the second encapsulation layer 138 and with a silane ($SiH_4$) precursor. The oxide layer deposition can be performed at the first CVD temperature or at a second CVD temperature that is near to the first CVD temperature. As an example, where the first CVD temperature is approximately 400° C. (i.e., plus or minus 10° C.), the second CVD temperature can be approximately 350° C. (i.e., plus or minus 10° C.).

Although the oxide layer 140 may have a greater thickness than the second encapsulation layer 138, it may be beneficial to pursue only a minimum oxide thickness (e.g., 143) during a first oxide layer deposition process in which the same CVD tool is used as in the second encapsulation layer deposition 360. Because a second oxide thickness 145 can be developed during a subsequent deposition process. Delaying the second oxide deposition (i.e., the subsequent CVD process) allows the overall fabrication process to be streamlined.

To that end, the process durations for forming the second encapsulation layer 138 and the first oxide layer 142 can be substantially equal to each other. Alternatively, the process duration for forming the second encapsulation layer 138 can be greater than the process duration for forming the first oxide layer 142. In either case, this back-to-back deposition process prevents substantial cooling of the second encapsulation layer 138 while allowing the minimum oxide thickness 143 to be developed. This process arrangement may lead to a relatively similar distribution of thickness between the second encapsulation layer 138 and a first oxide layer 142.

Figure 3H:
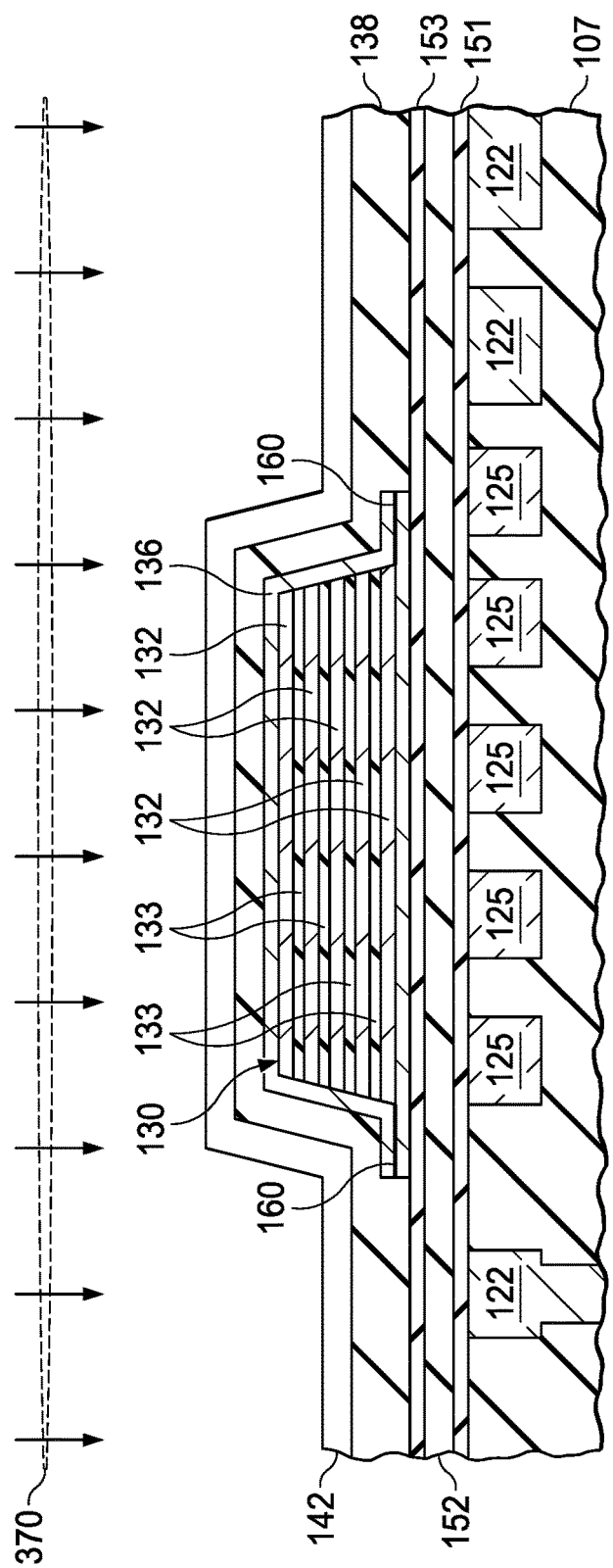

Thus, step 224 may be performed to deposit a single layer of oxide during one deposition process or multiple layers of oxide during multiple deposition processes. For the second scenario, step 224 may be implemented according to a process 230 as shown in FIG. 2B. The process 230 starts at step 232, which includes forming a first silicon oxide layer 142 with a silane precursor subsequent to the forming of the second encapsulation layer 138. FIG. 3H, shows a cross sectional view of an integrated fluxgate device (e.g., 120) when step 232 is performed. A first oxide layer deposition 370 is performed to deposit a first oxide layer 142. In one implementation, the first oxide layer deposition 370 includes using the same chemical vapor deposition (CVD) tool as the second encapsulation layer deposition 360, which can be plasma-enhanced (i.e., PECVD). The deposition 370 is performed in a chamber at a second CVD temperature, which can be the same or is near to the first CVD temperature. For example, where the first CVD temperature is around 400° C. (i.e., plus or minus 10° C.), the second CVD temperature can be about 350° C. (i.e., plus or minus 10° C.) or higher.

The deposition 370 applies silane ($SiH_4$) and oxygen (O) as precursors. The first oxide layer 142 thus includes a silicon oxide material with a minimum oxide thickness 143. The second deposition duration of the first oxide layer 142 may be substantially the same as, or less than, the first deposition duration of the second encapsulation layer deposition 360. Because silicon oxide formed by a silane precursor typically has good uniformity, the first silicon oxide layer 142 conforms to a contour of the magnetic core structure 130. According to an aspect of the disclosure, the minimum oxide thickness 143 can be 4,000 Å where the second encapsulation layer 138 has a thickness of about 4,700 Å. Although the deposition 370 may further develop the silicon oxide layer to a greater thickness, it is advantageous to refrain from doing so in some cases. This is because the second encapsulation layer deposition 360 as shown in FIG. 3G uses the same deposition tool as the first oxide layer deposition 370. By delaying the silicon oxide growth to a later time, the overall fabrication process can be streamlined as the depositions 360 and 370 can take turn sharing the same deposition tool to prevent substantial cooling of the deposited layers (i.e., 130, 136, and 138). Advantageously, the arrangement of the depositions 360 and 370 allows the integrated fluxgate circuit 100 to be substantially crack-free around the corners of the magnetic core structure 130.

In an alternative implementation, a tetraethyl orthosilicate (TEOS) precursor can be used in the deposition 370 for forming the first oxide layer 142. However, silicon oxide layers formed by TEOS precursors typically have lower uniformity than those formed by silane precursors. Hence, the TEOS-based silicon oxide layer may or may not conform to the contour of the magnetic core structure 130. In the event that the TEOS-based silicon oxide layer does not conform well to the contour of the magnetic core structure 130, the TEOS-based silicon oxide layer may be less effective in performing its stress relief function. Accordingly, it may be more preferable to use TEOS-based silicon oxide to grow on top of the silane-based silicon oxide.

Figure 3I:
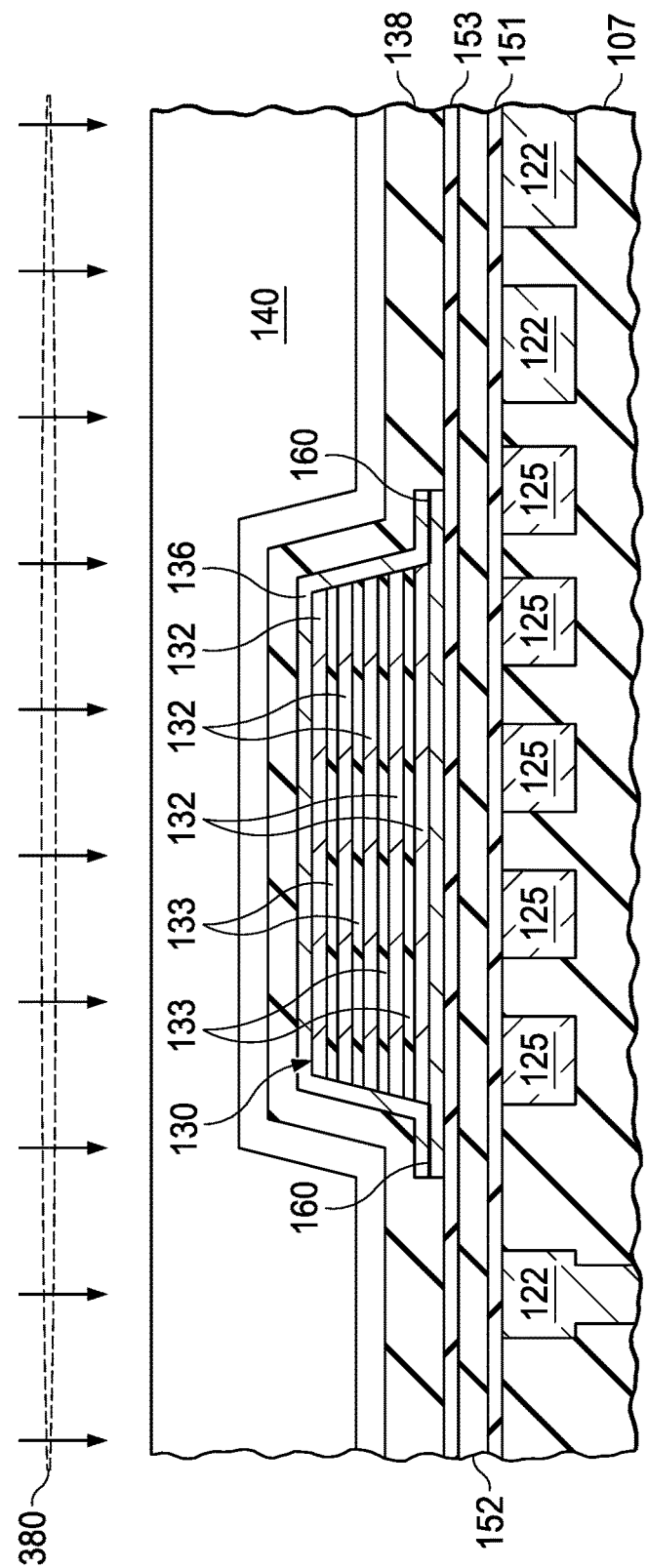

After step 232 is performed, the process 230 proceeds to step 234, which includes forming a second silicon oxide layer 144 with a tetraethyl orthosilicate (TEOS) precursor subsequent to the forming of the first silicon oxide layer 142. Since the first silicon oxide layer 142 is already in place to serve as a stress relief structure, the integrated fluxgate circuit 100 may undergo substantial cooling without sustaining any crack at the corners of the magnetic core structure 130. FIG. 3I, shows a cross sectional view of an integrated fluxgate device (e.g., 120) when step 234 is performed. A second oxide layer deposition 380 is performed to deposit a second oxide layer 144. In one implementation, the second oxide layer deposition 380 includes using the same chemical vapor deposition (CVD) tool as the second encapsulation layer deposition 360, which can be plasma-enhanced (i.e., PECVD). In another implementation, the second oxide layer deposition 380 includes using a different CVD tool, which can also be plasma-enhanced. The deposition 380 applies a TEOS precursor, such that the second oxide layer 144 may or may not conform to the contour of the magnetic core structure 130. To prepare for further fabrication processes, the second oxide layer 144 is planarized to have a top surface that conforms to the surface of the substrate 107.

Figure 3J:
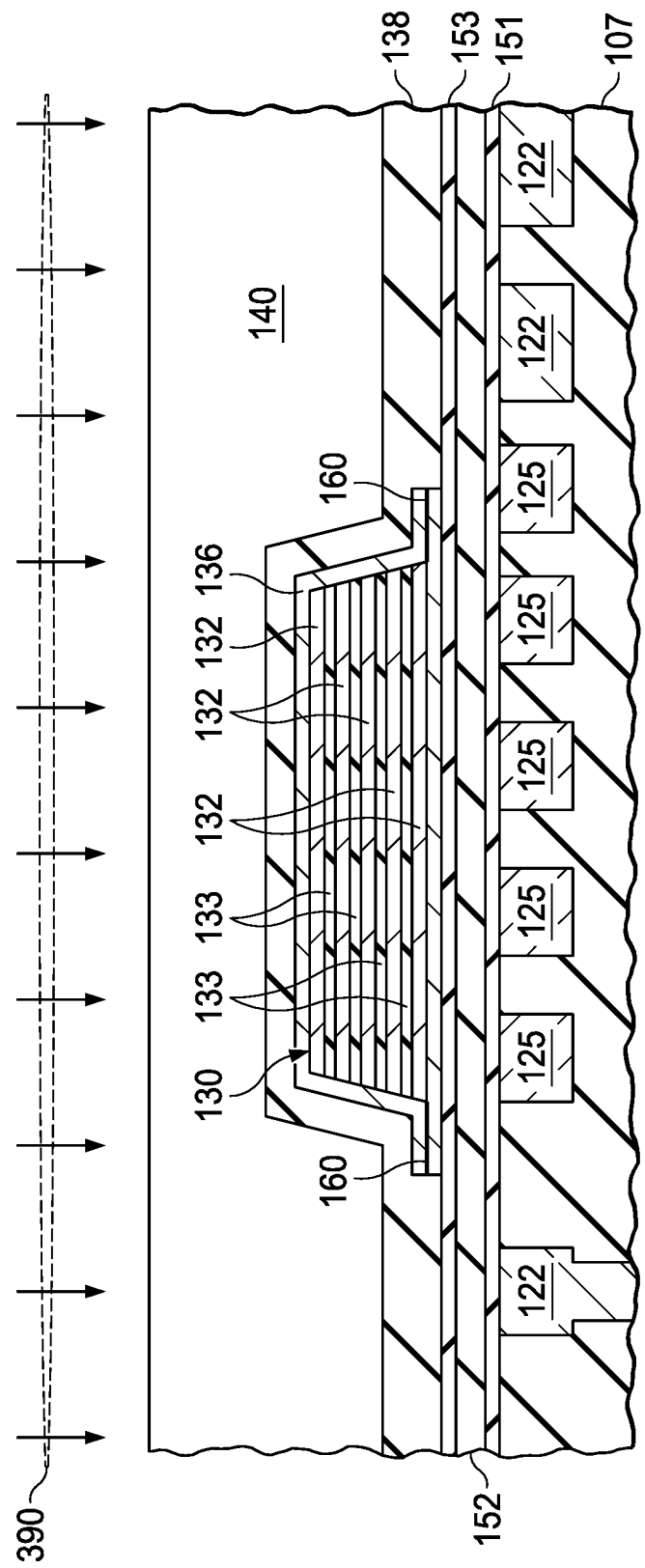

In an alternative process flow where multiple depositional tools are available, the oxide deposition of one wafer can be performed concurrently with the second encapsulation layer deposition 360 of a different wafer. The oxide deposition may take a longer duration than the second encapsulation layer deposition 360. This allows a single oxide layer 140 to be formed above the second encapsulation layer 138. Referring to FIG. 3J, a cross sectional view of an integrated fluxgate device (e.g., 120) is shown according to a process in which step 224 is performed to form a single oxide layer 140. A single oxide layer deposition 390 is performed to deposit a single oxide layer 140. In one implementation, the oxide layer deposition 390 includes using a chemical vapor deposition (CVD) tool, which can be plasma-enhanced (i.e., PECVD). The deposition 390 is performed in a chamber at a second CVD temperature, which can be the same or is near to the first CVD temperature. For example, where the first CVD temperature is around 400° C. (i.e., plus or minus 10° C.), the second CVD temperature can be about 350° C. (i.e., plus or minus 10° C.) or higher.

The deposition 390 applies silane ($SiH_4$) and oxygen (O) as precursors. The oxide layer 140 thus includes a silicon oxide material with a single oxide thickness that is greater than the minimum oxide thickness 143. In one implementation, the single oxide thickness can be the sum of the first oxide thickness 143 and the second oxide thickness 145 as shown in FIG. 1. For instance, the single oxide thickness can be greater than 4,000 Å where the second encapsulation layer 138 has a thickness of about 4,700 Å. Because silicon oxide formed by a silane precursor typically has good uniformity, the single silicon oxide layer 140 conforms to a contour of the magnetic core structure 130 after it is formed. Like the second oxide layer 144 as shown in FIG. 3I however, a planarization process can be performed to planarize the top surface of the single oxide layer 140. As such, the top surface of the planarized single oxide layer 140 conforms to the surface of the substrate 107.

After step 224 is performed, the process 200 proceeds to step 226, which includes forming top coil members (e.g., top coil members 126) above the second encapsulation layer 138 and in the oxide layer 140.

Consistent with the present disclosure, the term "configured to" purports to describe the structural and functional characteristics of one or more tangible non-transitory components. For example, the term "configured to" can be understood as having a particular configuration that is designed or dedicated for performing a certain function. Within this understanding, a device is "configured to" perform a certain function if such a device includes tangible non-transitory components that can be enabled, activated, or powered to perform that certain function. While the term "configured to" may encompass the notion of being configurable, this term should not be limited to such a narrow definition. Thus, when used for describing a device, the term "configured to" does not require the described device to be configurable at any given point of time.

Moreover, the term "exemplary" is used herein to mean serving as an example, instance, illustration, etc., and not necessarily as advantageous. Also, although the disclosure has been shown and described with respect to one or more implementations, equivalent alterations and modifications will be apparent upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous. Moreover, the separation of various system components in the embodiments described above should not be understood as requiring such separation in all embodiments.

What is claimed is:

1. A method, comprising:
   forming an etch stop layer above a substrate;
   forming a first titanium layer on the etch stop layer;
   forming a magnetic core on the first titanium layer;
   forming a second titanium layer having a first portion encapsulating the magnetic core with the first titanium layer and a second portion interfacing with the first titanium layer beyond the magnetic core;
   forming a mask over a magnetic core region; and
   etching the first and second titanium layers exposed by the mask using a titanium etchant and a titanium oxide etchant.

2. The method of claim 1, further comprising:
   forming a circuit having transistors on the substrate;
   forming a metal layer interconnecting the transistors; and
   forming a dielectric layer above the metal layer and below the etch stop layer.

3. The method of claim 1, wherein the forming the second titanium layer includes interfacing the second portion of the second titanium layer with a titanium oxide layer on the first titanium layer.

4. The method of claim 1, wherein the forming the magnetic core includes:
   forming a magnetic core layer including nickel iron layers interleaving with insulation layers;
   patterning the magnetic core layer with a photo-resist mask; and
   ashing the photo-resist mask.

5. The method of claim 1, wherein:
   the etching includes a reactive ion etching using the titanium etchant and the titanium oxide etchant; and
   the titanium etchant includes a boron trichloride ($BCl_3$) plasma and a chlorine ($Cl_2$) plasma defining a titanium etchant ratio of the $BCl_3$ plasma to the $Cl_2$ plasma greater than two-third.

6. The method of claim 5, wherein the titanium etchant ratio ranges from two-third to two.

7. The method of claim 5, wherein the titanium etchant ratio is equal to or greater than two.

8. The method of claim 1, wherein the etching the first and second titanium layers includes forming a carbon-based polymer sidewall protecting the first portion of the second titanium layer while the second portion of the second titanium layer is etched.

9. The method of claim 1, wherein:
   the etching includes a reactive ion etching using the titanium etchant and the titanium oxide etchant; and
   the titanium oxide etchant includes a trifluoromethane ($CHF_3$) plasma.

10. The method of claim 1, wherein the etching includes a reactive ion etching applying a substrate bias voltage less than 100 V.

11. The method of claim 1, further comprising:
    monitoring a gaseous concentration associated with the etch stop layer; and
    terminating the etching upon detecting the gaseous concentration reaches a predetermined threshold.

12. The method of claim 1, further comprising:
    preserving the first titanium layer from being etched before the forming the magnetic core and before the forming the second titanium layer.

13. A method, comprising:
    forming an etch stop layer above a substrate;
    forming a first titanium layer on the etch stop layer;
    forming a magnetic core on the first titanium layer while preserving the first titanium layer from being etched;
    forming a second titanium layer having a first portion encapsulating the magnetic core with the first titanium layer and a second portion interfacing with the first titanium layer beyond the magnetic core;
    forming a mask over a magnetic core region;

etching the first and second titanium layers exposed by the mask using a titanium etchant and a titanium oxide etchant;

monitoring a gaseous concentration associated with the etch stop layer; and terminating the etching upon detecting the gaseous concentration reaches a predetermined threshold.

14. The method of claim 13, wherein the forming the second titanium layer includes interfacing the second portion of the second titanium layer with a titanium oxide layer on the first titanium layer.

15. The method of claim 13, wherein:

the etching includes a reactive ion etching using the titanium etchant and the titanium oxide etchant; and the titanium etchant includes a boron trichloride ($BCl_3$) plasma and a chlorine ($Cl_2$) plasma defining a titanium etchant ratio of the $BCl_3$ plasma to the $Cl_2$ plasma greater than two-third.

16. The method of claim 13, wherein:

the etching includes a reactive ion etching using the titanium etchant and the titanium oxide etchant; and the titanium oxide etchant includes a trifluoromethane ($CHF_3$) plasma.

17. The method of claim 13, wherein the etching includes a reactive ion etching applying a substrate bias voltage less than 100 V.

* * * * *